Feb. 10, 1970 C. A. BROWN ET AL 3,495,139

SEMICONDUCTOR DEVICE ASSEMBLY USING HEAT-SHRINKABLE TUBING

Filed March 4, 1968

INVENTORS
CHARLES A. BROWN
BY LYLE W. QUATROCHI

OSTROLENK, FABER, GERB & SOFFEN
ATTORNEYS

United States Patent Office 3,495,139
Patented Feb. 10, 1970

3,495,139

SEMICONDUCTOR DEVICE ASSEMBLY USING HEAT-SHRINKABLE TUBING

Charles A. Brown, Los Angeles, and Lyle W. Quatrochi, Palos Verdes, Peninsula, Calif., assignors to International Rectifier Corporation, Los Angeles, Calif., a corporation of California Filed Mar. 4, 1968, Ser. No. 709,986
Int. Cl. H01l 3/00, 5/00, 9/00
U.S. Cl. 317—234 6 Claims

ABSTRACT OF THE DISCLOSURE

A semiconductor assembly formed of a stack of one or more semiconductor wafers and electrodes for opposite surfaces of the wafer stack are rigidly held together by a tube of heat-shrinkable plastic material. The semiconductor wafers are of selenium or silicon which may be formed with rectifying junctions. The electrodes are formed by winding one end of a conductive lead into a flat spiral which is placed across the wafer surface to be contacted.

This invention relates to semiconductor device assemblies, and more particularly relates to a novel assembly of semiconductor wafers and electrodes therefor where the components are mechanically held in position and are electrically connected to one another by a heat-shrinkable plastic tubing.

It is a primary object of this invention to provide an inexpensive and reliable semiconductor device.

Another object of this invention is to provide a novel semiconductor device assembly which avoids conventional metallic fastening devices, solder or weld joints, or complexly machined housing members.

These and other objects of this invention will become apparent from the following description when taken in connection with the drawings, in which.

Figure 1:
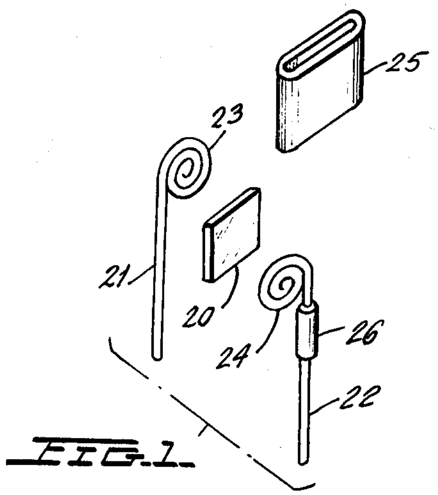
FIGURE 1 shows a first embodiment of the invention in exploded perspective view.
Figures 2, 6, 7, 8:
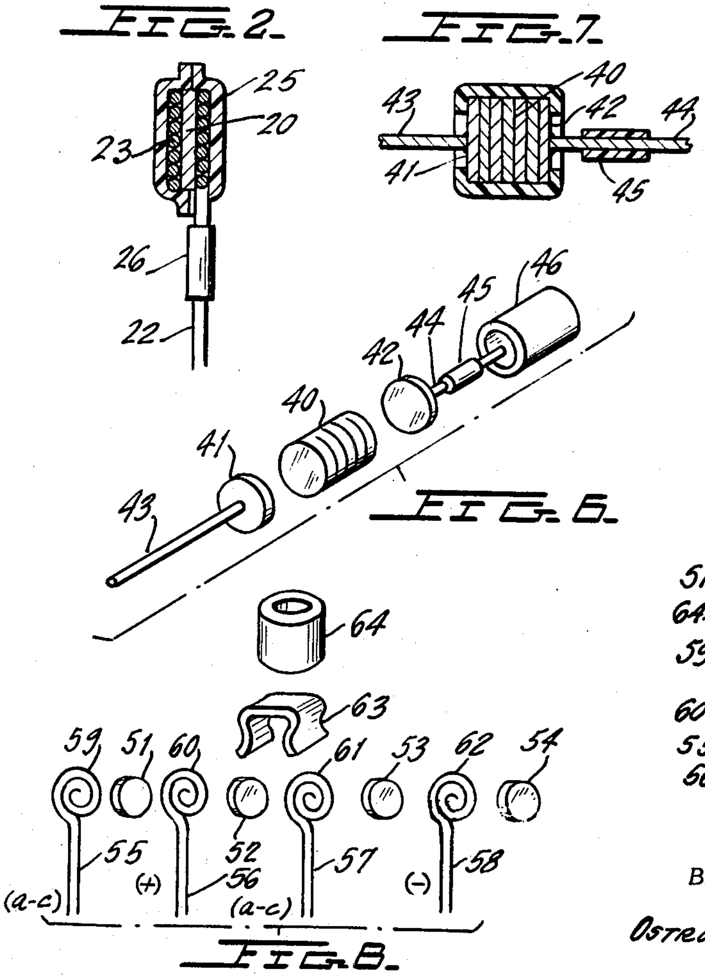
FIGURE 2 is a cross-sectional view of the assembled device of FIGURE 1.
FIGURE 6 is an exploded perspective view of a further embodiment of the invention.
FIGURE 7 is a cross-sectional view of the assembled device of FIGURE 6.
FIGURE 8 is an exploded perspective view of a further embodiment of the invention.

Referring first to FIGURES 1 and 2, there is shown a selenium rectifier wafer 20 which may have a square shape and dimensions of about ⅜ inch by ⅜ inch and a thickness of about 1/64 inch. The manufacture of selenium plates of this type is well known, and wafer 20 is stamped from such a larger plate in the well-known manner. If desired, wafer 20 could be of silicon or some other material having one or more rectifying junctions therein. A pair of tinned wire leads 21 and 22 of number 20 wire, having any desired length, such as 3 inches, then have their ends tightly coiled into flat spiral windings 23 and 24, respectively, having diameters of about ⅜ inch (about four turns of wire). Windings 23 and 24 are then placed adjacent the opposite surfaces of wafer 20. Preferably, the diameter of coils 23 and 24 is less than the length or width of wafer 20 to prevent inadvertent shorting of the leads 21 and 22. Coils 23 and 24 and wafer 20 are then held together in a suitable jig and a tube of heat-shrinkable plastic material 25, which can loosely fit over the assembly, is moved into place around the components. Tube 25 may, for example, be an electron irradiated polyolefin material of any of the well-known commercially available types, and could have a thickness of about 1/16 inch.

The assembly is then placed in an oven and heated to about 300° C. for about 5 seconds, causing tube 25 to contract, thereby to rigidly hold the components 20, 23 and 24 in position. At the same time, a small tube 26 of appropriately colored heat-shrinkable tubing can be placed on lead 22, for polarity identification, where red tubing would identify the negative terminal of the rectifier device.

Figure 3:
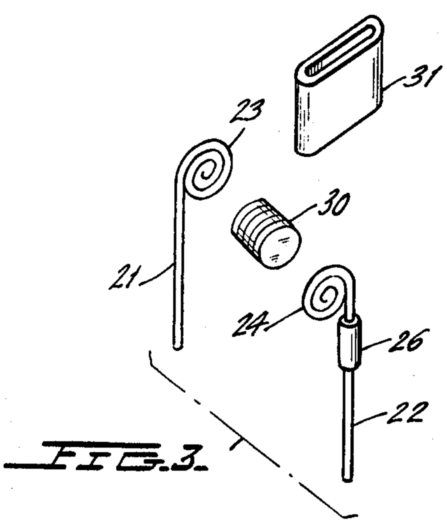
FIGURE 3 is an exploded perspective view of a second embodiment of the invention.
Figures 4, 5, 9:
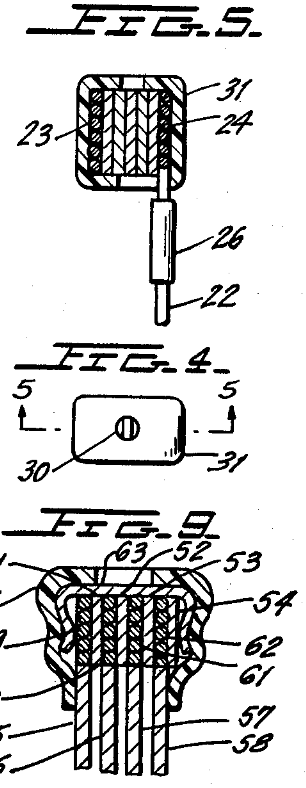
FIGURE 4 is a top view of the assembled device of FIGURE 3.
FIGURE 5 is a cross-sectional view of FIGURE 4 taken across the section line 5—5 in FIGURE 4.
FIGURE 9 is a cross-sectional view of the assembled device of FIGURE 8.

FIGURES 3, 4 and 5 show an embodiment of the invention for a stack of circular selenium wafers for the formation of a higher voltage rectifier than possible with the single plate 20 of FIGURES 1 and 2. The heat-shrinkable tubing 31 of FIGURES 3, 4, and 5 is similar to that of FIGURES 1 and 2, except that it will have a larger diameter to encompass the larger volume due to the wafer stack 30. Leads 21 and 22 of FIGURES 3, 4 and 5 are similar to those of FIGURES 1 and 2, with tubing 31 contracting to hold the assembly together and to hold coils 23 and 24 against the end surfaces of stack 30.

FIGURES 6 and 7 show a further embodiment of the invention for an axial lead-type rectifier device. Thus, in FIGURES 6 and 7, a stack of selenium rectifiers 40 are assembled between two leads, each lead consisting of brass disks 41 and 42, respectively, and tinned wire leads 43 and 44, respectively, which are pre-soldered to their respective disks 41 and 42. Lead 44 may carry a color-coded sleeve 45. A heat-shrinkable tube 46 then envelopes the assembly, and, upon heating, contracts as shown in FIGURE 7 to hold the assembly together.

FIGURES 8 and 9 show a further embodiment of the invention wherein a single phase, full wave bridge circuit can be formed. In FIGURES 8 and 9, selenium wafers 51, 52, 53 and 54 are rectifier elements stacked with alternating polarities and having diameters of about ¼ inch. Four leads 55, 56, 57 and 58 are formed with spiral coils 59, 60, 61 and 62, respectively, having diameters less than ¼ inch. Leads 55 and 57 are A-C leads, while leads 56 and 58 are positive and negative D-C leads respectively. Leads 55 to 58 may carry insulation tubing (not shown) to prevent accidental shorting which is color-coded to identify the lead.

A brass metallic bus 63 electrically connects the end surfaces of wafers 51 and 54 together and to lead 55. Thereafter, a heat-shrinkable tubing 64 is placed over the assembly and heated to contract it, as shown in FIGURE 9, and to secure the assembly together and against slipping out of bus 63.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A semiconductor device assembly comprising a semiconductor wafer means, a first and a second elongated lead wire and a tube of heat-shrinkable plastic material; first and second flat electrode means connected to one end of each of said lead wires; said first and second flat electrode means positioned adjacent the opposite surfaces, respectively, of said semiconductor wafer means; said tube of heat-shrinkable material tightly enveloping said first and second electrode means and said wafer means and holding said first and second electrode means in electrical and mechanical engagement with said wafer means; said first and second lead wires extending beyond said tube of heat-shrinkable material; at least one of said lead wires having a color-coded tube of heat-shrinkable material thereon.

2. The device of claim 1 wherein said wafer means is of a material selected from the group consisting of selenium, germanium and silicon.

3. The device of claim 1 wherein said wafer means is a stack of rectifier wafers of selenium material.

4. The device of claim 1 wherein said first and second flat electrode means each comprises a spiral coil formed of said first and second lead wires, respectively.

5. The device of claim 1 wherein said first and second flat electrode means each comprises a flat uniform disk of conductive material.

6. The device of claim 4 wherein said wafer means is a selenium rectifier.

References Cited

UNITED STATES PATENTS 2,737,618 3/1956 Eisler ............. 317—234

JOHN W. HUCKERT, Primary Examiner

R. F. POLISSACK, Assistant Examiner

U.S. Cl. X.R.

317—235